United States Patent [19]

Nishizawa et al.

[11] Patent Number: 5,038,188
[45] Date of Patent: * Aug. 6, 1991

[54] INSULATED-GATE TYPE TRANSISTOR AND SEMICONDUCTOR INTEGRATED CIRCUIT USING SUCH TRANSISTOR

[75] Inventors: Jun-ichi Nishizawa; Tadahiro Ohmi, both of Sendai, Japan

[73] Assignee: Zaidan Hojin Handotai Kenkyu Shinkokai, Sendai, Japan

[ * ] Notice: The portion of the term of this patent subsequent to Jul. 3, 2007 has been disclaimed.

[21] Appl. No.: 492,057

[22] Filed: Mar. 12, 1990

Related U.S. Application Data

[60] Division of Ser. No. 82,979, Aug. 4, 1987, Pat. No. 4,939,571, which is a continuation of Ser. No. 669,741, Nov. 7, 1984, abandoned, and a continuation of Ser. No. 238,968, Feb. 27, 1981, abandoned, and a continuation of Ser. No. 32,219, Apr. 23, 1979, abandoned.

[30] Foreign Application Priority Data

May 1, 1978 [JP] Japan .................................. 53-53194

[51] Int. Cl.$^5$ ...................... H01L 29/10; H01L 29/78; H01L 29/68; H01L 49/00
[52] U.S. Cl. .................................. 357/23.3; 357/23.4; 357/23.8; 357/86
[58] Field of Search .................... 357/23.3, 23.4, 23.8, 357/86

[56] References Cited

U.S. PATENT DOCUMENTS

| | | |
|---|---|---|
| 3,440,500 | 4/1969 | Coppen . |
| 3,600,642 | 8/1971 | Allison et al. . |
| 3,909,320 | 9/1974 | Cauge et al. . |
| 4,070,687 | 1/1978 | Ho et al. . |
| 4,072,975 | 2/1978 | Ishitani . |
| 4,078,947 | 3/1978 | Johnson et al. . |
| 4,084,175 | 4/1978 | Ouyang . |
| 4,106,045 | 8/1978 | Nishi . |
| 4,132,998 | 1/1979 | Dingwall . |
| 4,158,238 | 6/1979 | Erb . |
| 4,172,260 | 10/1979 | Okabe et al. . |
| 4,316,203 | 2/1982 | Tohgei . |
| 4,334,235 | 6/1982 | Nishizawa ........................... 357/23.3 |
| 4,345,265 | 8/1982 | Blanchard . |
| 4,939,571 | 7/1990 | Nishizawa et al. ................. 357/23.3 |

FOREIGN PATENT DOCUMENTS

| | | |
|---|---|---|
| 965188 | 3/1975 | Canada . |
| 53-99778 | 8/1978 | Japan . |
| 53-113483 | 10/1978 | Japan . |

OTHER PUBLICATIONS

T. Ohmi, "Punching Through Device and its Integration-Static Induction Transistor", IEEE Transactions on Electron Devices, vol. Ed-27, No. 3, Mar. 1980, pp. 536-545.
P. Richman, "MOS Field Effect Transistors and Integrated Circuits", c 1973, TK 7871.85.R466, Wiley-Interscience, Inc., 86-107.
C. Bertin et al., "Substrate Contact Design," IBM Tech. Discl. Bull., vol. 148, Jan. 1972, 2316.
B. Crowder et al., "DMOS FET with Common Field and Channel Doping", IBM Tech. Discl. Bull., vol. 20, No. 4, Sep. 1977, pp. 1617-1621.

Primary Examiner—Rolf Hille
Assistant Examiner—Wael Fahmy
Attorney, Agent, or Firm—Cushman, Darby & Cushman

[57] ABSTRACT

An insulated-gate type transistor having a semiconductor body of a low impurity concentration, a heavily-doped source region of a conductivity type opposite to that of the semiconductor body for supplying charge carriers, a heavily-doped region for receiving the carriers supplied form the source region, both of which regions may be provided separately in a main surface of the body, a channel region located between the source and drain regions for the travel of these carriers, an insulated-gate structure inputted with a gate voltage for controlling the travel of those carriers, a semiconductor region formed in the neighborhood of the source region within the body and having a portion located below the source region and another portion extending beyond therefrom toward the drain region and serving to define the channel region and to increase the ratio of the amount of carriers reaching the drain region to the total amount of the carriers supplied from the source region. This transistor can be easily manufactured with a single substrate from that side of the main surface. This transistor is suitable for use in constructing integrated circuits and enables construction of complementary devices.

2 Claims, 7 Drawing Sheets

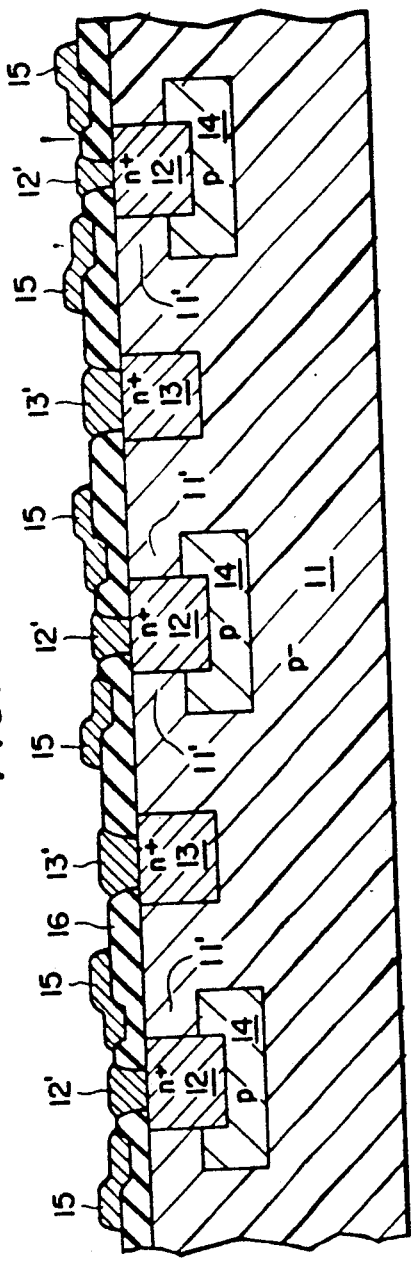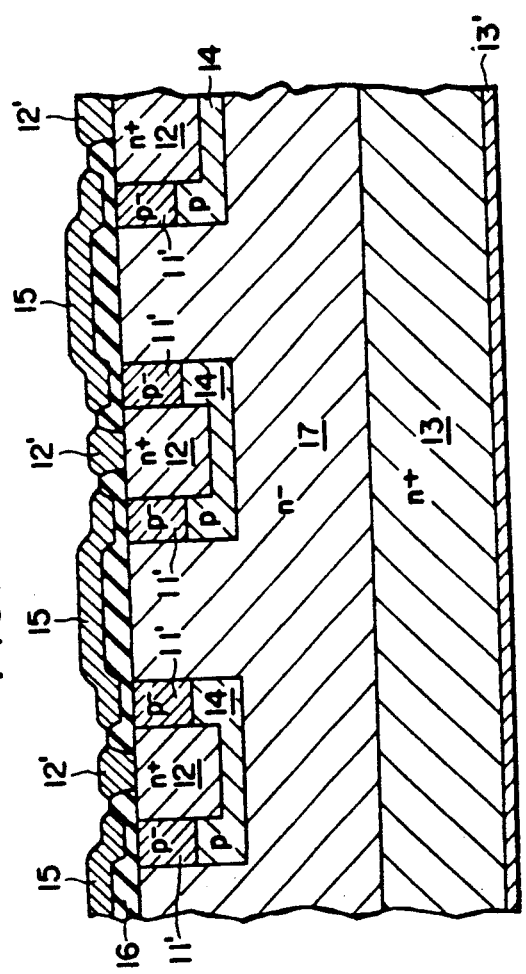

INSULATED-GATE TYPE TRANSISTOR AND SEMICONDUCTOR INTEGRATED CIRCUIT USING SUCH TRANSISTOR

This is a division of application No. 07/082,979, filed Aug. 4, 1987, now U.S. Pat. No. 4,939,571, a continuation of application Ser. No. 06/669,741 filed Nov. 7, 1984, abandoned; a continuation of application Ser. No. 06/238,968, filed Feb. 27, 1981, abandoned; a rule 60 continuation of application Ser. No. 06/032,219, filed Apr. 23, 1979.

BACKGROUND OF THE INVENTION (a) Field Of The Invention

The present invention concerns an insulated-gate type transistor, and a semiconductor integrated circuit structure using such transistor, and more particularly it pertains to an insulated-gate type transistor, such as insulated-gate type static induction transistor, having substantially reduced series resistance and gate capacitance and being easy to manufacture and exhibiting a non-saturating current versus voltage characteristic, and also pertains to a semiconductor integrated circuit structure using such transistors.

(b) Description Of The Prior Art

A static induction transistor (hereinafter to be referred to briefly as SIT) whose drain current continues to increase with an increase in its drain voltage has been proposed by Jun-ichi NISHIZAWA in U.S. patent application Ser. No. 817,052 and by Jun-ichi NISHIZAWA et al., in U.S. patent application Ser. No. 576,541.

An SIT has been found to be superior in each of its various properties including high power and large current capacity, high breakdown voltage, low distortion, low noise, low power dissipation, and high-speed operation. This SIT is a transistor which is abundant in excellent properties including its thermal characteristic, when compared with known bipolar transistors and known field effect transistors. The superiority of SIT when employed either as a discrete element or as an element for use in integrated circuit has been proved already, and thus new fields of its application are being developed in various technological fields. Since the input impedance of the SIT is high, it can be directly coupled to a preceding stage of circuitry without any amplifying stage. Furthermore, since the SIT requires only a little driving power, it contributes to enhancing packing density. Moreover, because the SIT exhibits a non-saturating type current versus voltage characteristic, and because it has a large transconductance, a large fan-out can be obtained. Thus, the SIT is extremely suitable for use in integrated circuit.

Basic structures of insulated-gate (IG) SIT (MOS-SIT and MIS-SIT) which operate either in the so-called enhancement mode (E-mode) or the so-called depletion mode (D-mode) have been elucidated already by J. NISHIZAWA et al. in, for example, U.S. patent application Ser. No. 867,298 and by J. NISHIZAWA in Japanese patent application Laying-open No. 53-99778 entitled "MOS, MIS Static Induction Transistor", and by J. NISHIZAWA in U.S. Pat. No. 4,334,235, and also by J. NISHIZAWA in Japanese Patent Application Laying open No. 53-113483 entitled "MOS, MIS Static Induction Transistor".

An insulated-gate type SIT (hereinafter to be referred to as IG-SIT) having a reduced gate capacitance and a large transconductance has been proposed by J. NISHIZAWA et al. also in their U.S. patent application Ser. No. 867,298. An example of its structure in case of an n-channel IG-SIT is shown in the attached FIG. 1. In this Figure, n+ type regions 1 and 3 represent a source region and a drain region. A p− type region, 2 represents a channel-forming region part of which will be used as a channel. Numeral 4 represents a gate electrode, 5 a p type substrate, 5' a p type region protruding from the substrate 5 and touching the source region 1, and 6 an insulating layer made with, for example, $SiO_2$, $Al_2O_3$, $Si_3N_4$ or AlN, or their mixture, or their composite insulating layer. Also, numerals 1' and 3' represent a source electrode and a drain electrode.

In case a typical drain voltage applied is assumed to be $V_D$, the impurity concentration of the p− type region 2 is selected to be a value in the vicinity of $2\epsilon(V_D+V_{bi})\epsilon l^2$, or a value slightly higher than that, wherein $\epsilon$ represents the dielectric constant of the p− type region 2, e represents the magnitude of electronic charge, l represents the source-to-drain distance, and $V_{bi}$ represents the built-in potential at the n+p− junction between the channel region 2 and the drain region 3. The channel width in the vicinity of the source region is narrowed by bulging upwardly the p type region 5' to ensure that the current flowing from the source region into the drain region can be effectively controlled by the gate electrode 4.

The structure shown in FIG. 1 is such that the p type protruding portion 5' requires to be formed either by epitaxial growth of a p− type region on top of a selectively etched p type substrate 5 and 5', or by carrying out selective diffusion of an n type impurity into the p type substrate to locally convert this p type region into a p− type region 2 and to leave the rest of the p type region 5 and 5' as it was, or by forming a p type embedded-type protrusion 5' by ion-implantation into a preliminarily epitaxially grown p− type region 2 located on the p type substrate 5, etc. Thus, the manufacturing process of this structure requires inconvenient additional steps, and accordingly the cost of manufacture becomes all the more expensive.

SUMMARY OF THE INVENTION

It is, therefore, the object of the present invention to provide an insulated-gate type SIT or an insulated-gate type transistor exhibiting a non-saturating type current versus voltage characteristic, which exhibits substantially the same characteristic as that of the IG-SIT shown in FIG. 1, by a simpler process.

BRIEF DESCRIPTION OF THE DRAWINGS

FIGS. 8A and 8B are schematic sectional views of multi-channel IG-SITs according to further embodiments of the present invention.

DETAILED DESCRIPTION OF THE PREFERRED EMBODIMENTS

The present invention will hereunder be explained in detail by referring to the accompanying drawings.

Figure 2A:
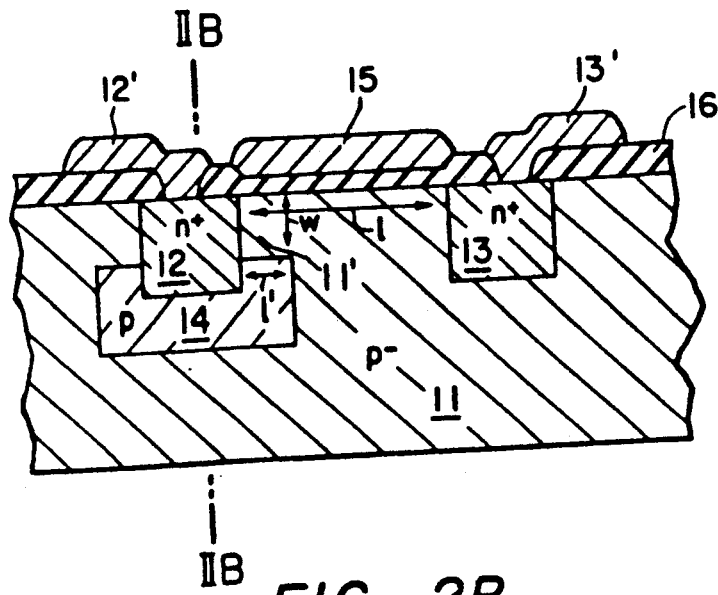
FIGS. 2A and 2B are schematic sectional views of an IG-SIT according to an embodiment of the present invention.

FIG. 2A is a sectional view of an n-channel insulated-gate type transistor exhibiting a non-saturating type current versus voltage characteristic, such as an IG-SIT according to an embodiment of the present invention. In the Figure, n+ type regions 12 and 13 represent a source region and a drain region, respectively, separated by a distance l. Electrodes 12' and 13' are provided on these source and drain regions 12 and 13. A p− type region 11 may be a substrate or a layer formed on a substrate (not shown in such case). A p type region 14 represents a region intended for defining the channel width W at least in the vicinity of the source region 12. Such defined channel region will be effectively subjected to the influence of a gate voltage applied to a gate electrode 15. As regards the channel width W which can be effectively controlled by a gate voltage applied to the gate electrode 15, detailed description is made in the aforesaid U.S. patent application Ser. No. 867,298. Numeral 16 represents an insulating layer made with, for example, $SiO_2Si_3N_4$, $Al_2O_3$, or AlN, or their mixture or their composite insulating layer. The semiconductor material is usually silicon. However, the semiconductor material may also be GaAs, other semiconductor materials, or their combination. Suppose that the impurity concentration of the p− type region 11 is $N_A$, and supposing that a typical drain voltage in the main operational state of the device is $V_D$, the distance l between the source region and the drain region will be set at a value in the vicinity of $\{2\epsilon(V_D+V_{bi})/N_A \cdot e\}^{\frac{1}{2}}$ or slightly longer than that. In case, however, that the gate electrode extends from the source region toward the drain region so as to encompass the whole channel region as shown in FIG. 2A, the value of the distance l may be set considerably smaller than the value mentioned above. The potential of the channel region is controlled by the potential of the gate electrode. When the gate electrode is long, the effect of the drain voltage upon that portion located near the source region decreases. It should be understood that, as the gate insulating layer located beneath the gate electrode is made less thick, the potential of the channel will be better controlled by the potential of the gate electrode. At least, the potential at the surface of the semiconductor body immediately beneath the gate insulating layer is rendered almost equal to the gate potential. In case the semiconductor substrate is made of silicon, the p type region 14 may be easily formed by ion-implantation of such p type impurity substance as boron (B). The impurity concentration of this p type region 14 is selected higher than that of the channel-forming p− type region 11. When such a drain voltage is applied as will develop a depletion layer extending from the drain region 13 to the foreground of the source region 12, the potential barrier, which is present in the foreground of the source region is pulled down under the influence of the drain voltage. The drain current will therefore sharply increase with an increase in the drain voltage. The drain current in such operational state will vary in accordance, basically, with exponential law with respect to the drain voltage as well as to the gate voltage. When the amount of the drain current increases beyond some magnitude and the negative feedback of the series resistance comes into effect, the increase in the drain current will become gradually gentler. It should be understood that the potential barrier is controlled also by the gate voltage, as a matter of course. In case a certain magnitude of positive voltage is applied to the gate electrode, an inversion layer is formed in the vicinity of the surface of the semiconductor body, and as a result a resistive current will begin to flow. The impurity concentration and the dimensions of the channel region are so selected that the depletion layer extending from the drain region will easily reach the vicinity of the source region, and the pinch-off point is arranged to be located close to the source region so that the channel-forming inversion layer has a large width, the series resistance from the source region up to the pinch-off point is small, and thereby the negative feedback action of this series resistance is small. Thus, the device will exhibit a non-saturating current versus voltage characteristic. The non-saturating characteristic can also be exhibited even in that region where a resistive current flows. More specifically, this means that, with an increase in the drain voltage, the pinch-off point (the end of the drain-side depletion layer) will gradually move toward the source region. When the pinch-off point reaches the source region, the current versus voltage characteristic becomes the barrier-height-control-type. Namely, the current is controlled by the potential barrier which is present in front of the source region, and the drain current basically follow the exponential law not only for the gate voltage but also for the drain voltage. When the current becomes large, the negative feedback action of the series resistance between the source electrode and the potential barrier and the voltage drop across the drain resistance from the intrinsic gate to the drain region, become appreciable. Then, the increase in drain current will step out of the exponential law and the rate of current increase will become gentler.

In FIG. 2A, there is shown a case wherein a p type region laterally protrudes toward both sides of a source region 12. It should be understood; however, that the protrusion of the p type region 14 only toward the drain region side is sufficient for the transistor action of the device shown.

Figure 2B:
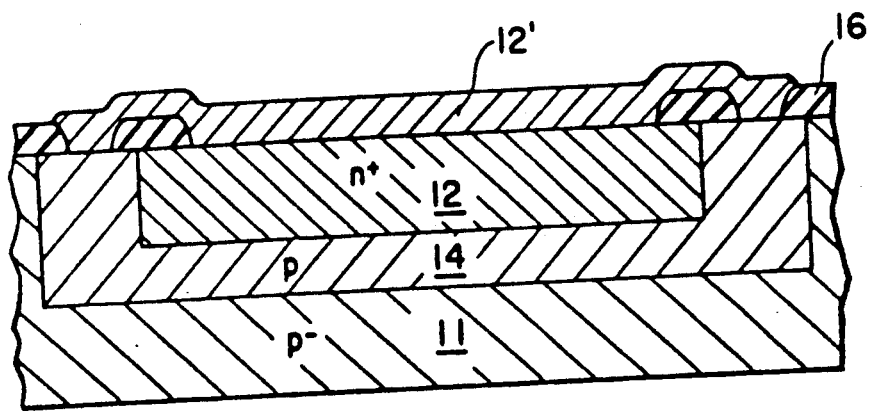
Figure 2C:
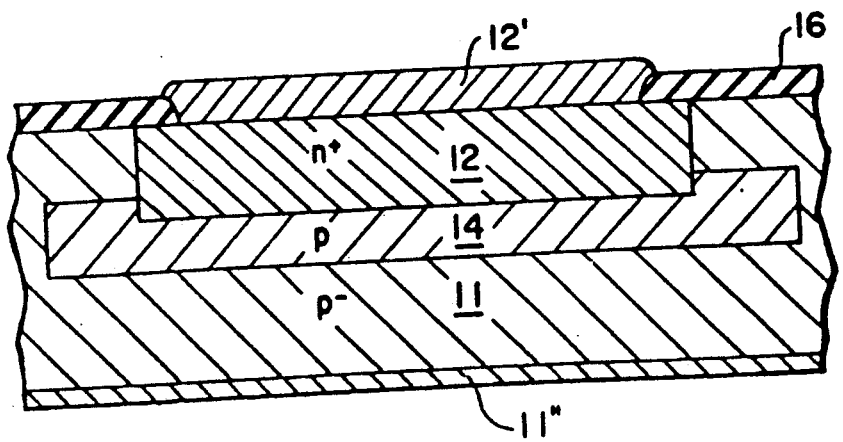
FIG. 2C is a schematic sectional view of an IG-SIT showing an alternative structure of FIG. 2B according to another embodiment of the present invention.

FIG. 2B shows a sectional view taken at the control part of the source region 12 along line IIB—IIB perpendicularly to the sheet of drawing. As shown in the Figure, the p type region 14 surrounds the source region 12 and is exposed at the semiconductor surface adjacent to source region 12. The p type region 14 is electrically connected or short-circuited to the source region 12 by a source electrode 12'. It should be understood, however, that, instead of such direct coupling of the p type region 14 to the source region 12, the p type region 14 may be given an independent potential. Alternatively, the p type region 14 may be used as a floating region. In case an electrode is provided at the bottom surface of the substrate 11 to apply a back bias, consideration should be given so that no current will be allowed to flow between the p type region 14 and the back-bias electrode. Alternatively, the p type region 14 may be embedded in the semiconductor body as shown in FIG. 2C. In this case, the p type region 14 is inevitably floated. In the Figure, numeral 11'' represents an electrode for back-biasing.

This p type region 14 is a region for defining, between it and the semiconductor surface, a channel region 11' for allowing the flow of current. Therefore, the impurity concentration of this p type region 14 is selected so that the depletion layer will not substantially enter into this region 14 either by a drain voltage or by a gate voltage. The impurity concentration of the p⁻ type region 11 is selected to be about $10^{13}$–$10^{15}$ cm⁻, and the impurity concentration of the p type region 14 is selected to be at least one order of magnitude larger and preferably at least $10^{16}$ cm⁻³.

The impurity concentration $N_A$ of the p⁻ type region 11, the depth W from the surface up to the p type region 14, and the distance l' of protrusion of the type region 14 extending toward the drain region side are determined substantially based on the following considerations.

Figure 1:
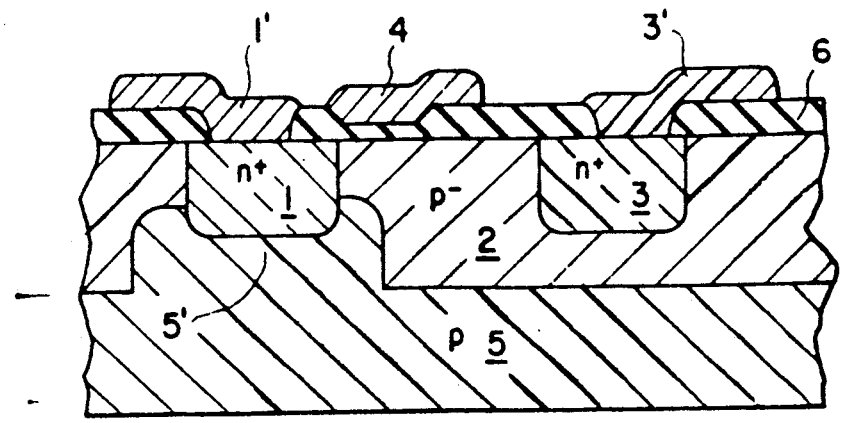
FIG. 1 is a diagrammatic sectional illustration of an example of structure of a conventional IG-SIT.
Figure 3A:
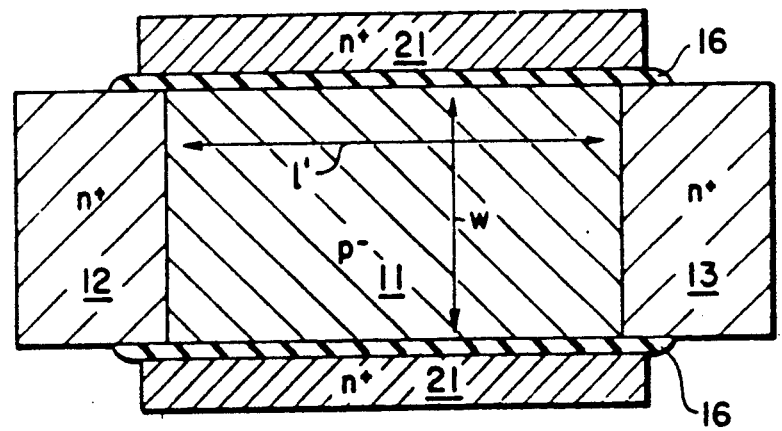
FIGS. 3A and 3B are diagrammatic illustrations of a model for designing insulated-gate type transistor according to the present invention.
Figure 3B:
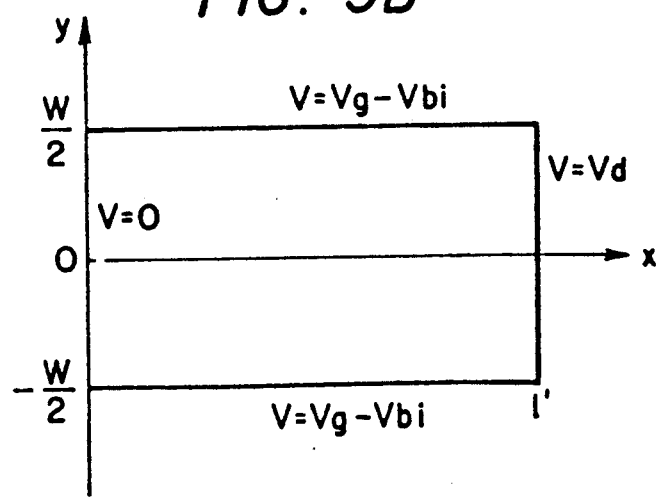

For simplifying the analysis a device model as shown in FIG. 3A is considered. The n⁺ type regions 12 and 13 represent a source region and a drain region, respectively. A pair of n⁺ type region 21 represents gate regions or gate electrodes. Let us now suppose that an insulating layer 16 has a sufficiently small thickness. Then, the boundary conditions when the drain 13 is applied with a voltage $V_d$ and when the gate 21 is applied with a voltage $V_g$ will be given as shown in FIG. 3B. Symbol $V_{bi}$ represents the built-in potential at the n⁺p⁻ junction between the n⁺ type gate region 21 and the p⁻ type channel region 11. The potential of the source region is zero. The potential distribution when the p⁻ type region 11 is entirely depleted, and when, thus, holes which are mobile charge carriers have ceased to be present in this region 11 will be given by the following formula, wherein $N_A$ represents the impurity concentration of the p⁻ type region 11:

x and y represent space coordinates (distance);
$\epsilon$ represents a dielectric constant; and
e represents the magnitude of electronic charge.

Figure 4A:
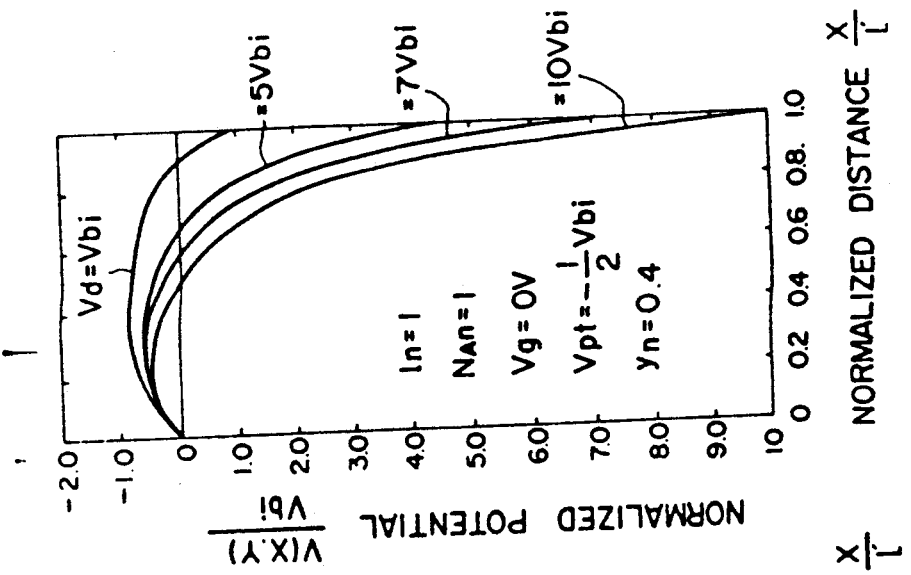
FIGS. 4A to 4C are graphs showing potential distribution in the model device shown in FIGS. 3A and 3B, wherein ordinate represents normalized potential $V(x,y)/V_{bi}$ and abscissa represents normalized distance $x/l'$.

Hereunder will be shown typical potential distributions obtained from formula (1). The potential distributions from the source region up to the drain region at $Y_n=0$, $Y_n 0.2$ and $Y_n=0.4$, in case $V_g=0V$, $V_d=5V_{bi}$, $N_{An}=1$, $V_{pt}=(eN_A l'^2/2\epsilon)-V_{bi}=(-\frac{1}{2})V_{bi}$ and $l_n=1$, will be as shown in FIG. 4A. In case of $Y_n=0$ wherein the distance from the gate electrode is the longest, the height of the potential barrier located in front of the source region is the lowest. As the location approaches closer to the gate electrode, as in $Y_n=0.2$ and $Y_n=0.4$, the height of the barrier becomes greater. Since $V_g=0$, there is present, between the gate electrode and the channel, a potential difference corresponding to the built-in potential. In case $N_{An}=1$ and $l_n=1$, i.e. in case the $N_A=\epsilon V_{bi}/eW^2$ and $l'=W$, it should be understood that, even when the gate potential is held zero, if a voltage of $5V_{bi}$ is applied to the drain region, there will be no potential barrier where $Y_n=0$, i.e. along the central part of the channel region. Accordingly, there will take place injection of carriers from the source region, and a current will allowed to flow freely. Here, $V_{bi}$ can vary depending on the impurity concentration of the p⁻ type region 11. In case this region is made of silicon, $V_{bi}$ will have a value of about 0.65 eV to about 0.9 eV. This value will become a little greater in case of GaAs. For example, if W = 1μm and $V_{bi}=0.8$ eV, the impurity concentration of the p⁻ type region and the distance of protrusion of the p type region toward the drain side will become: $N_A-5.3\times10^{14}$ cm⁻³, and l' = 1μm. In this instant device, by the application of a voltage of 4V to the drain region, carriers will be allowed to be injected after passing over the lowered potential barrier, and thus a current will be allowed to flow.

Figure 4B:
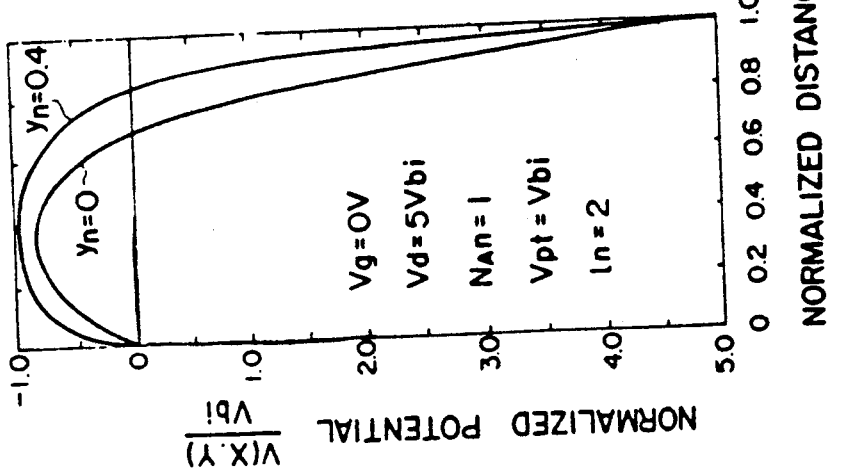

Now, the potential distributions when l' is extended to a length twice that of the length mentioned above, while the impurity concentration and the voltage are retained under the same conditions as those mentioned above, will be shown in FIG. 4B. Even at $Y_n=0$, there is present a sufficiently high potential barrier, so that no current will be allowed to flow. In case the length of the channel is extended furthermore, the potential within the channel will become controlled almost by the gate $$\phi_n(x, y) = \frac{4(V_{dn} - V_{gn} + 1)}{\pi} \sum_{n=0}^{\infty} \frac{\sinh(2n + 1)\pi x_n \cdot \sin(2n + 1)\pi y_n}{(2n + 1)\sinh(2n + 1)\pi l_n} -$$

$$\frac{4(V_{gn} - 1)}{\pi} \sum_{n=0}^{\infty} \frac{\sinh(2n + 1)\pi(l_n - x_n) \cdot \sin(2n + 1)\pi y_n}{(2n + 1)\sinh(2n + 1)\pi l_n} +$$

$$V_{gn} - 1 - \frac{16}{\pi^4} N_{An} \sum_{n,m} \frac{\sin\frac{(2n + 1)\pi}{l_n} x_n}{(2n + 1)(2m + 1)\left\{\left(\frac{2n + 1}{l_n}\right)^2 + (2m + 1)^2\right\}}$$

(1)

Wherein: the respective physical quantities are normalized as follows:

$$\phi_n(x, y) = \frac{\phi(x, y)}{V_{bi}}, \quad V_{dn} = \frac{V_d}{V_{bi}}, \quad V_{gn} = \frac{V_g}{V_{bi}}$$

$$l_n = \frac{l'}{W}, \quad x_n = \frac{x}{W}, \quad y_n = \frac{y}{W}, \quad N_{An} = \frac{N_A e W^2}{\epsilon V_{bi}}$$

Figure 4C:
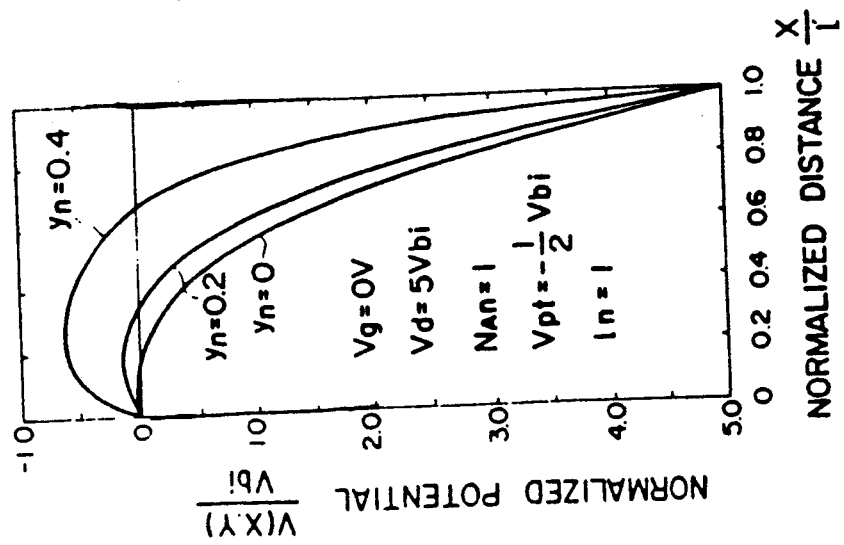

Wherein:

electrode, and thus the influence of the drain voltage will become weaker. FIG. 4C shows the potential distributions at $Y_n=0.4$ when, in the same device as that shown in FIG. 4A, the drain voltage $V_d$ is increased to the values: $V_{bi}$, $5V_{bi}$, $7V_{bi}$ and $10V_{bi}$. Even in the case of $l_n=1$, that portion located close to the gate electrode will be subjected strongly to the control by the gate voltage, and it is not easily influenced by the drain voltage. Such condition is shown in FIG. 4C.

From the foregoing considerations, the impurity concentration $N_A$ of the $p^-$ type region 11 which will serve as the channel region, the depth W of the p type region 14 from the surface, and the distance l' of protrusion of the p type region 14 toward the drain region in the device shown in FIG. 2A, are selected in such a way that the effect of the drain voltage applied will extend to the vicinity of the source region. As a matter of course, the smaller the value of $N_A$ is, and the greater the value of W is, and the shorter the value of l' is, the more influence will give the drain voltage to the vicinity of the source region.

Figure 5:
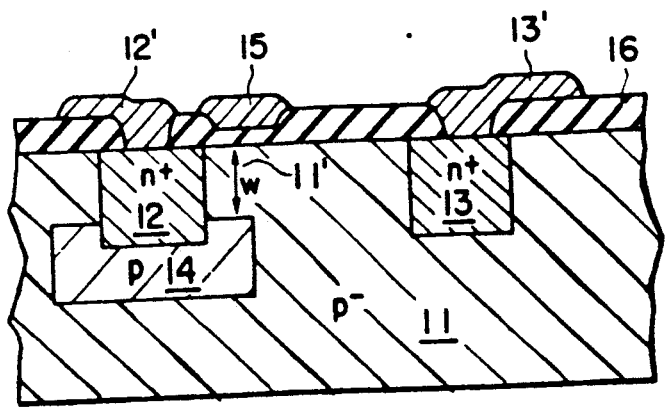
FIGS. 5 through 7 are schematic sectional views of IG-SITs according to respective embodiments of the present invention.

FIG. 5 shows a sectional structure of another embodiment of the present invention. This embodiment has the arrangement that the gate electrode does not extend to the drain region, but is provided only in a site located close to the source region, to ensure that the depletion layer extending from the drain region will easily reach the vicinity of the source region. Other arrangement is substantially the same as that of the embodiment shown in FIG. 2A. The structure shown in FIG. 5 is such that the gate capacitance is reduced corresponding to the amount of reduction of the area of the gate electrode, so that this device is suitable for high-speed operation. Also, because of the provision of the gate electrode only in the neighborhood of the source region, the effect of the gate voltage near the drain region is reduced and the effect of the drain voltage will easily reach the vicinity of the source region. Accordingly, the drain current will have a sharp build-up characteristic. A vertical structure relative to the sheet of this figure may be made according to either the arrangement of FIG. 2B or that of FIG. 2C.

Figure 6:
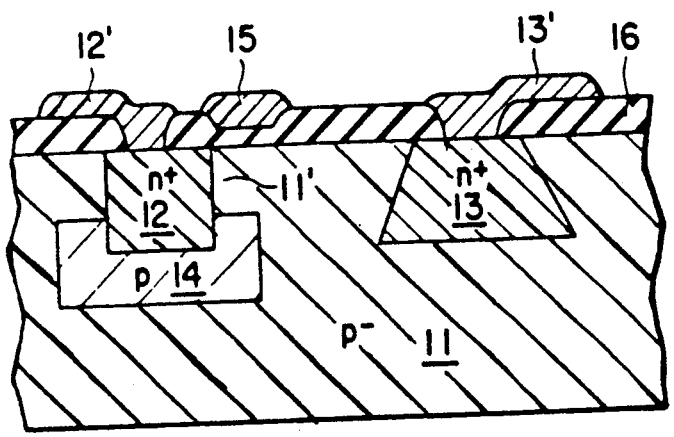

FIG. 6 shows a sectional structure of still another embodiment of the present invention. In this embodiment, the drain resistance is reduced to further improve the build-up of current. The drain region 13 has such structure that it will substantially approach the source region 12 as the drain goes farther away from the surface of the semiconductor body, to ensure that the electrons which flow out of the channel region 11' will travel away from the semiconductor surface and divergently into the bulk of the semiconductor body. Since the carriers flow divergently in the semiconductor bulk, the conduction is not of surface conduction near the semiconductor surface but of bulk conduction. Wide current path and higher carrier mobility contribute to a reduction of the drain resistance.

Figure 7:
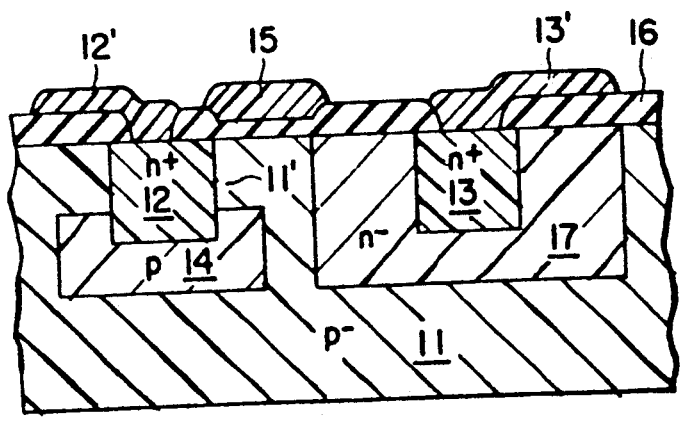

In each of the structures shown in FIGS. 2A, 5 and 6, space charge resistance is apt to intrude into the drain resistance. In order to overcome this disadvantage, it is only necessary to provide a high resistivity sub-drain region having a conductivity type same as that of the drain region. FIG. 7 shows an embodiment in which such a sub-drain region is provided around the drain region in an arrangement as shown in FIG. 2A. Since an $n^-$ type sub-drain region 17 will be charged positive when depleted, this positive electric charge does not prevent the flow of electrons and the negative charge of electrons which flow thereinto will electrically cancel each other, so that a space charge resistance is unlikely to appear. In other words, the resistance at the conducting state (i.e. the so-called on-resistance) will be very small. In this embodiment, the $n^-$ type region 17 is positioned apart from the p type region 14. It should be understood, however, that these two regions may be in contact with each other, as a matter of course. Also, the $n^-$ type region 17 may be positioned close to the source region. The $n^-$ type region 17 is shown as being provided symmetrically on both sides of the $n^+$ type drain region 13. However, this region 17 may be provided only on the source region side. Similar subdrain region may also be provided in the structures of FIGS. 5 and 6, needless to say. A vertical structure relative to the sheet of FIG. 7 may be formed in accordance with the structure shown in FIGS. 2B or 2C.

Devices having the structures of FIGS. 2A and 5 may be formed by, for example, relying on ion-implantation of the p type region 14 and then by a simultaneous diffusion or ion-implantation of the $n^+$ type regions 12 and 13. The remaining steps are just an insulating layer formation step and an electrode formation step. Thus, the manufacture of this device is quite easy. It is needless to say that in the structures of FIG. 2 and FIGS. 5 through 7, the impurity concentration of the $p^-$ type channel region 11' located in the vicinity of the source region may be different from that of other $p^-$ type region 11.

FIG. 8A shows a multi-channel transistor, wherein a multiplicity of the IG-SIT structure as described above are disposed side-by-side to form a discrete IG-SIT exhibiting a non-saturating type current versus voltage characteristic. Each unit including a source region, a channel region and a drain region has a structure similar to that of FIG. 5. It will be noted that source regions 12 and drain regions 13 are disposed in alternate fashion and that each of the source regions 12 and the drain regions 13 is common to two adjacent units. The source electrodes 12', the drain electrodes 13' and the gate electrodes 15 are arranged in, for example, elongated stripe pattern aligned vertically relative to the sheet of the drawing. Basically, they are arranged in inter-digital form. A multiplicity of source (gate, or drain) electrodes may be integrated into a comb-like shape. It will be needless to say that any other structure shown in FIGS. 2A, 6 and 7 or their modifications may be incorporated into a multi-channel structure. As will be clear to those skilled in the art, as the number of channels is increased, the current which is allowed to flow will become larger, and thus a high power operation becomes possible.

In the structure of FIG. 8A, all of the source electrodes, the gate electrodes and the drain electrodes are provided on one main surface of the semiconductor substrate. Accordingly, such structure essentially requires a multi-layered wiring, and formation of such wiring will bring some technical difficulty. Also, in case it is intended to elevate the breakdown voltage between the gate region and the drain region, the distance between the drain region and the gate region will naturally becomes long, and thus the area utility efficiency drops. Especially, in order to materialize a high power and high breakdown voltage insulated-gate type transistor exhibiting a non-saturating type current versus voltage characteristic such as a power MOS transistor, utilization of the bulk region of the semiconductor body is desirable. FIG. 8B shows a lateral/vertical insulated-gate type transistor. The structure in the vicinity of the source region is similar to that of the other embodiments. However, a common drain region 13 is provided on the other main surface located opposite to said one main surface. An $n^-$ type sub-drain region 17 connects this drain region 13 with the channel regions 11'. Each channel region 11' is defined between the one main surface and a p type region 14 adjacent to a source region 12 similar to the preceding embodiments. Thus, charge carriers flow basically laterally in the channel region 11'. Then, those carriers having passed through the channel region 11' begin to travel vertically down to the drain region 13 through the sub-drain region 17. It is possible to determine the breakdown voltage so as to lie in the range of desired values by appropriately setting the thickness and the impurity concentration of the $n^-$ type region 17. Provision of the sub-drain region is rather essential in this type of structure because the carriers travelling through the channel region should be well controlled by the gate electrode formed on the one main surface and because the drain region is formed in the other main surface. Thus, the $n^-$ type region 17 serves to allow charge carriers to flow substantially vertically between the two main surfaces. Provision of the (p type) region 14 having the same conductivity type as that of the ($p^-$ type) channel region 11' is also essential for isolating the source region 12 from the drain region 13 and from the sub-drain region 17. In this structure, it is only necessary to arrange the source electrodes and the gate electrodes in an inter-digital fashion, and accordingly the wiring is easy. Also, in this example, various dimensions and impurity concentrations of the concerned regions are selected so as to ensure that the influence of the drain voltage will extend easily to the source region. Accordingly, a large amount of electrons will be injected from the source region having a high impurity concentration into the drain side channel region, and thus the "on" resistance at the conducting state will become extremely small. Though, a matter of course, breakdown voltage can be made very high. The impurity concentration and the dimensions of the p type region 14 are selected so that there will not occur a flow of current due to a punching-through state between the source region and the drain region, via the p type region 14. The p type region 14 may be arranged so as to be directly coupled to the source region 12 by an electrode as shown in FIG. 2B.

Figure 9B:
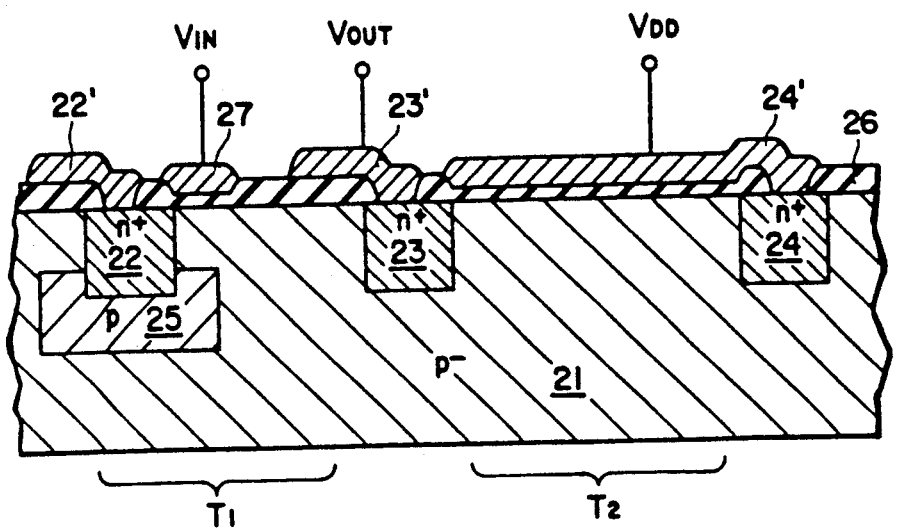
FIGS. 9A and 9B are an equivalent circuit diagram and a schematic sectional view of an integrated circuit arrangement using IG-SIT of the present invention.
Figure 9A:
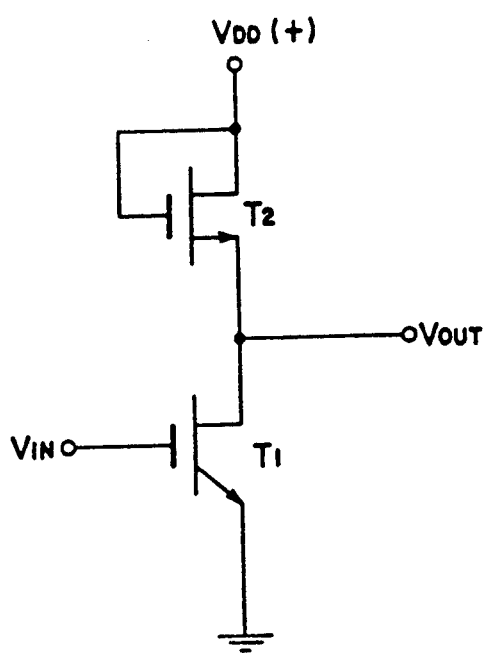

In FIG. 9A is shown an equivalent circuit of an inverter circuit using, as a driver transistor $T_1$, an insulated-gate type transistor exhibiting a non-saturating type current versus voltage characteristic, i.e. IG-SIT. FIG. 9B shows a sectional structure of such inverter circuit structure. A load transistor $T_2$ is formed by an IG-FET of saturated characteristic. This IG-FET is arranged so that the distance between the source region and the drain region is longer than that of the non-saturating IG-SIT. Alternatively, the source-to-drain distance may be formed the same order as that of the IG-SIT when there is formed in the vicinity of the surface a p type region having a relatively high impurity concentration, for example, by relying on ion-implantation technique. An $n^+$ type region 22 serves as a source region of the IG-SIT $T_1$. Another $n^+$ region 23 serves as a drain region of the IG-SIT $T_1$ and concurrently as a source region of the IG-FET $T_2$. Another $n^+$ type region 24 serves as a drain region of the IG-FET $T_2$. Numeral 22' represents a source electrode of the IG-SIT, 23' a drain electrode of the IG-SIT which concurrently serves as a source electrode of the IG-FET, and 24' a gate electrode of the IG-FET which concurrently serves as a drain electrode thereof (meaning an integrated gate-drain electrode). Numeral 27 represents a gate electrode of the IG-SIT. Symbol $V_{DD}$ represents a power supply source, $V_{in}$ an input voltage, and $V_{out}$ an output voltage. When $V_{in}$ is at a low level, the IG-SIT $T_1$ is in its cut-off state. Accordingly, $V_{out}$ is at a high level almost equal to that of $V_{DD}$. When $V_{in}$ gains high level, IG-SIT $T_1$ is turned on and $V_{out}$ is at a low level close to the ground potential. In other words, the device will carry out an inverter operation.

In FIGS. 9A and 9B, there is shown a circuit arrangement that the gate electrode of the load IG-FET is directly coupled (short-circuited) to its drain region, i.e. so to speak an arrangement of the enhancement-mode FET. It is a matter of course, however, that arrangement may be made so that a load transistor is comprises of a depletion-mode FET wherein its gate electrode is directly coupled to its source region. Also, an $n^-$ type sub-drain region may be provided on the left side of the $n^+$ type drain 23 in the figure. Then, the resistance of the IG-SIT at the conducting state will become smaller, and the transconductance will become larger, and thus a further high-speed operation will be obtained.

Figure 10:
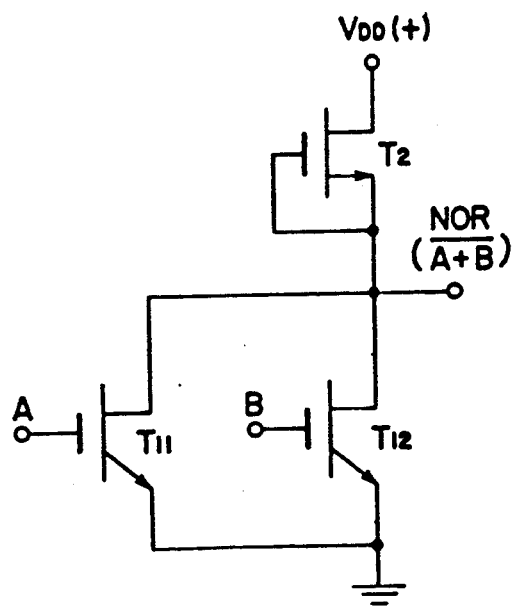
FIGS. 10 and 11 are equivalent circuit diagrams of integrated circuit structures using IG-SIT of the present invention.
Figure 11:
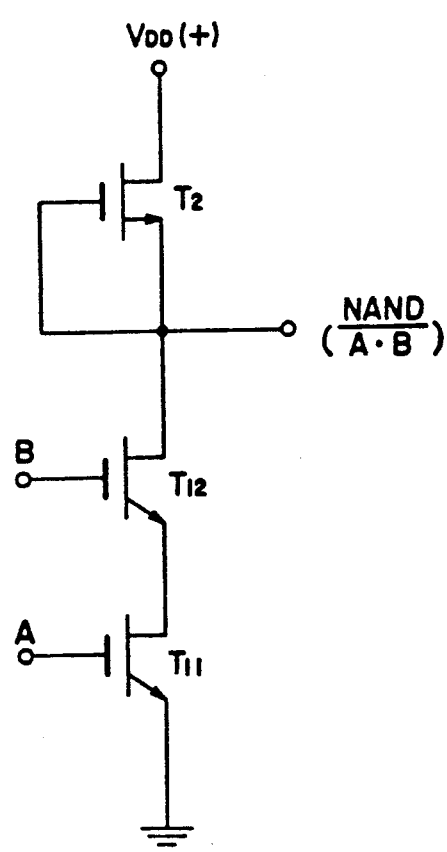

Although FIGS. 9A and 9B show only a basic inverter circuit, it should be understood, however, that a NAND circuit and a NOR circuit of multiple input terminals can also be constructed easily. For example, two-input NOR circuit and NAND circuit are shown in FIGS 10 and 11. Here, $T_{11}$ and $T_{12}$ represent insulated-gate type transistors of the present invention such as IG-SIT's exhibiting a non-saturating type current versus voltage characteristic. $T_2$ represents a depletion-mode MOS-FET. In other words, a circuitry having a large-scale operation capacity can be constructed with these transistors in an integrated structure.

Figure 12A:
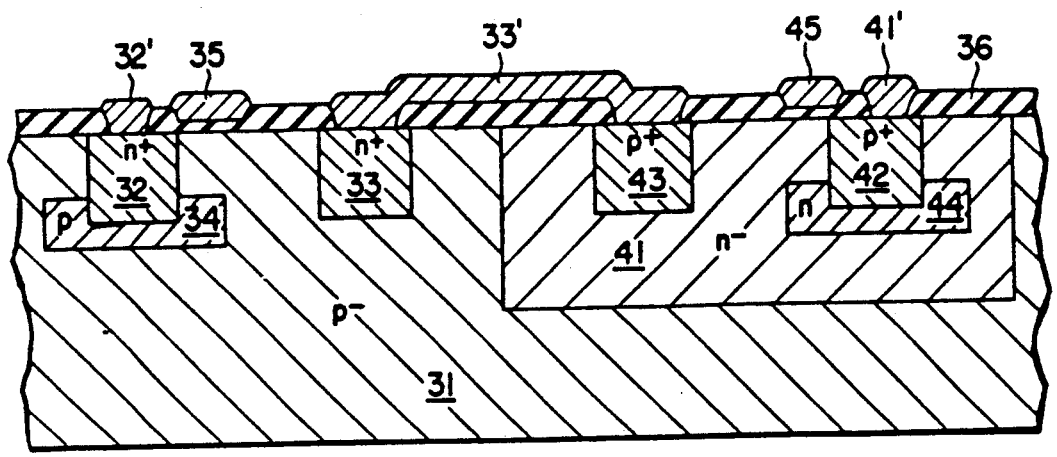
FIGS. 12A and 12B are a schematic sectional view and an equivalent circuit diagram of a complementary circuit structure according to another embodiment of the present invention.
Figure 12B:
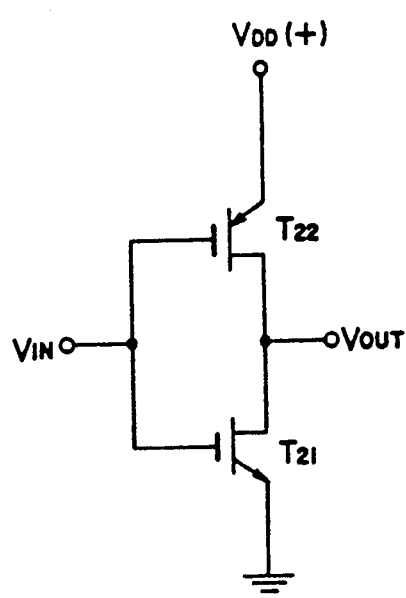

It is a matter of course that insulated-gate type transistors of the present invention which exhibit a non-saturating current versus voltage characteristic can be employed to construct a complementary structure. Such example is shown in FIGS. 12A and 12B, in which FIG. 12A is a sectional view and FIG. 12B shows an equivalent circuit thereof. Transistors $T_{21}$ and $T_{22}$ represent an n-channel transistor and a p-channel transistor embodying the present invention, respectively. Numeral 31 represents a $p^-$ type substrate, 32 an $n^+$ type source region, 33 an $n^+$ type drain region, 35 a gate electrode, 32' a source electrode, and 33' a drain electrode. A p type region 34 is provided on the bottom surface of the $n^+$ type source region 32. The p-channel transistor $T_{22}$ is formed within an $n^-$ type well 41. This transistor $T_{22}$ is comprised of a $p^+$ type source region 42, a $p^+$ type drain region 43 and a gate electrode 45. Numeral 41' represents a source electrode, and 36 an insulating layer. An n type region 44 is provided on the bottom surface of the $p^+$ type source region 42. The arrangement of the complementary structure of the transistors of the present invention having a large transconductance and a small resistance at the conducting state is extremely effective for obtaining a low energy and high operation speed device. Provision of a sub-drain region as shown in FIG. 7, will further improve the characteristic of the device. The p type region 34 and the n type region 44 may be exposed to the main surface as shown in FIG. 2B or may be embedded as shown in FIG. 2C.

Hereinabove, there have been mentioned some basic structures of insulated-gate type transistor which exhibits a non-saturating current versus voltage characteristic in connection with FIGS. 2, 5, 6 and 7, and some structures of discrete devices in connection with FIG. 6, and a structure of inverter circuit which forms the basis of integrated circuit in connection with FIG. 9. It will be needless to say that the basic structures and their applied structures of insulated-gate type semiconductor device of the present invention are not limited to the above-mentioned embodiments. The conductivity types of the respective regions can be reversed, as a matter of course. In short, it is only necessary that at least a portion located in the vicinity of the bottom of the source region departing away from the surface of this source region is arranged to be surrounded by a region of a relatively high impurity concentration and having a conductivity type opposite to that of the source region. At least one semiconductor region of a conductivity type same as that of the source region intervenes between this source-surrounding region and a main surface opposite to the source region. Needless to say, the impurity concentration of this source surrounding region may be sufficiently high. Furthermore, there has been shown an example wherein this region is always in direct contact with the source region. However, it may be separated from the source region. The point is that it is only necessary that the carriers flowing from the source region can be efficiently controlled. The load transistor in the inverter circuit also is not limited to an IG-FET, but it may be comprised of an IG-SIT.

The basic structure of the insulated-gate type transistor according to the present invention which exhibits a non-saturating type current versus voltage characteristic as shown in FIG. 2 or FIG. 5 can be made up by a single ion-implantation step of a region surrounding the vicinity of the bottom surface of the source region, and by a single ion-implantation step or diffusion step of the source region and the drain region. By forming thereon an insulating film and electrodes, a device can be built up. Thus, the manufacture is quite simple and easy. In the structures shown in FIGS. 6 and 7, an additional one ion-implantation step or diffusion step is required. In any way, insulated-gate type semiconductor device which exhibits a non-saturating type current versus voltage characteristic, and integrated circuit structure using such transistors according to the present invention can be easily manufactured by relying on ordinary known techniques, such as diffusion technique, ion-implantation technique, oxidation technique, wiring technique and like techniques.

The insulated-gate type transistor according to an aspect of the present invention which exhibits non-saturating current versus voltage characteristic has a small gate capacitance, a large transconductance, a small series resistance and a small drain resistance, and exhibits a sharp build-up of drain current, and is capable of effecting high-speed operation. The semiconductor integrated circuit structure employing such transistors according to another aspect of the present invention has a further advantage represented by high packing density as well as those mentioned above.

What is claimed is:

1. A multi-channel insulated type transistor formed in a semiconductor body having a first conductivity type, a low impurity concentration and a main surface, and having a plurality of units, each unit comprising:

a heavily-doped source region formed in said main surface of the semiconductor body, having a second conductivity type opposite to said first conductivity type for supplying charge carriers;

a heavily-doped drain region formed in said main surface of said semiconductor body at a site separate from said source region and having said second conductivity type for receiving the carriers supplied from said source region;

a subsidiary semiconductor region interposed between said source region and an underlying portion of said semiconductor body, said subsidiary region having said first conductivity type and an impurity concentration greater than that of said semiconductor body said semiconductor region not being in contact with said main surface and having a first portion disposed in contact with the bottom face of said source region, coextensive with said bottom face and a second portion extending laterally beyond said source region toward said drain region;

a channel semiconductor region of said one conductivity type located in said semiconductor body between said source and drain regions, disposed laterally adjacent to the source region between said main surface and said laterally extending second portion of said subsidiary semiconductor region, having an impurity concentration lower than of said subsidiary semiconductor region;

an insulated-gate structure including an insulating layer formed on said channel semiconductor region and a conductive gate electrode formed on said insulating layer; and said channel region having such dimensions and a resistivity that the potential profile from said source region to said drain region has a barrier which can be controlled by applied voltages of said conductive gate electrode and of said drain region.

2. An insulated-gate semiconductor device formed in a semiconductor body having first and second opposing principal surfaces, comprising:

a heavily-doped source semiconductor region of a first conductivity type disposed in said body adjacent to said first principal surface;

a heavily-doped drain semiconductor region of said first conductivity type disposed in said body adjacent to said second principal surface;

a subdrain semiconductor region of said first conductivity type and a resistivity higher than said drain semiconductor region, disposed from said source region, extending from said first principal surface to said drain region;

a channel region of a second conductivity type opposite to said first conductivity type and of predetermined resistivity disposed laterally adjacent to said source region at said first principle surface between said source and subdrain regions;

insulated gate means, including an insulting layer formed on said first principal surface and a conductive layer formed on said insulating layer over at least the channel region for generating a depletion layer extending into said channel region; and means for limiting the maximum extent of said depletion layer and for defining a current path having a portion in a direction generally parallel to said first principal surface and a portion in a direction transverse to said first principal surface, said means including a subsidiary semiconductor region of said second conductivity type and of a resistivity lower than said predetermined channel resistivity such that said depletion layer will not substantially enter said subsidiary region, said subsidiary regions being disposed in said body between said source and drain region and having a first portion underlying and in contact with the entire bottom face of said source region and a second portion extending in a direction generally parallel to said first principal surface to underlie at least a portion of said channel region;

said channel region having such dimensions and a resistivity that the potential profile from said source region to said drain region has a barrier which can be controlled by applied voltages of said conductive gate electrode and of said drain region.

* * * * *